US006365514B1

(12) United States Patent
Yu et al.

(10) Patent No.: US 6,365,514 B1
(45) Date of Patent: *Apr. 2, 2002

(54) TWO CHAMBER METAL REFLOW PROCESS

(75) Inventors: Jick Yu, Beaverton; Ruth Brain, Portland, both of OR (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/997,044

(22) Filed: Dec. 23, 1997

(51) Int. Cl.$^7$ ............................................. H01L 21/44
(52) U.S. Cl. ..................... 438/675; 438/688; 438/627; 438/643; 438/637; 438/672
(58) Field of Search ................. 438/627, 643, 438/688, 642, 675, 625, 629, 653, 648, 638, 612, 646, 637–640; 257/771, 765

(56) References Cited

U.S. PATENT DOCUMENTS

| | | | |
|---|---|---|---|
| 5,108,951 A | | 4/1992 | Chen et al. .................. 437/187 |
| 5,148,259 A | * | 9/1992 | Kato et al. ................... 438/642 |
| 5,270,255 A | * | 12/1993 | Wong .......................... 438/688 |
| 5,356,836 A | | 10/1994 | Chen et al. .................. 437/194 |
| 5,423,939 A | | 6/1995 | Bryant et al. ................. 216/18 |
| 5,443,995 A | | 8/1995 | Nulman ....................... 437/197 |
| 5,472,912 A | | 12/1995 | Miller ......................... 437/194 |
| 5,486,492 A | | 1/1996 | Yamamoto et al. ........... 437/192 |
| 5,523,259 A | * | 6/1996 | Merchant et al. ............ 438/643 |
| 5,527,739 A | | 6/1996 | Parrillo et al. .............. 437/198 |
| 5,534,463 A | * | 7/1996 | Lee et al. .................... 438/643 |
| 5,633,199 A | * | 5/1997 | Fiordalice et al. .......... 438/642 |
| 5,646,449 A | * | 7/1997 | Nakamura et al. .......... 257/761 |
| 5,658,828 A | * | 8/1997 | Lin et al. .................... 438/643 |
| 5,798,300 A | * | 8/1998 | Chittipeddi et al. ......... 438/627 |
| 5,804,501 A | * | 9/1998 | Kim ........................... 438/627 |
| 5,814,557 A | * | 9/1998 | Vekatraman et al. ........ 438/622 |
| 5,844,318 A | * | 12/1998 | Sandhu et al. .............. 257/774 |
| 5,846,877 A | * | 12/1998 | Kim ........................... 438/625 |
| 5,869,901 A | * | 2/1999 | Kusuyama ................... 257/263 |

FOREIGN PATENT DOCUMENTS

| | | | | |
|---|---|---|---|---|
| JP | 04051517 | * | 2/1992 | ......... H01L/21/285 |
| JP | 06342852 | * | 12/1994 | ........... H01L/21/90 |
| JP | 10693 | | 1/2000 | |

OTHER PUBLICATIONS

Paper Presented at SEMICON/Europe; Zurich, Mar. 1992, *Aluminum Contact–Hole Filing and Planarization*, J. Willer, H. Wendt and D. Emmer; pp. 1–8.

* cited by examiner

Primary Examiner—Charles Bowers
Assistant Examiner—Thanh Nguyen
(74) Attorney, Agent, or Firm—Benjamin Burge

(57) ABSTRACT

The present invention describes an improved process for forming an aluminum or aluminum alloy plug in the fabrication of a semiconductor device. An opening is formed in a wafer. A titanium wetting layer is then deposited over the wafer and lines the sidewalls and bottom of the opening. A first aluminum deposition step is performed at a first power in a hot deposition chamber. A second aluminum deposition step is performed at a second higher power in a cold deposition chamber. The present invention forms the aluminum plug without the problems of void formation and without reaching temperatures that could cause damage to underlying layers during the fabrication process.

26 Claims, 6 Drawing Sheets

TWO CHAMBER METAL REFLOW PROCESS

BACKGROUND OF THE INVENTION

1. Field of the Invention

This invention relates to the field of semiconductor devices, and more specifically, to a process for forming aluminum alloy plugs in the fabrication of semiconductor devices.

2. Background Information

As semiconductor devices become smaller so must the conductive contacts, plugs, vias, and interconnect lines of those devices. Tungsten (W) plug technology is widely used in the fabrication of semiconductor devices. However, tungsten plug technology entails the use of expensive equipment and a large number of processing steps.

A low cost alternative to tungsten plug technology is the use of aluminum (Al) and aluminum alloys to fill plugs. Additionally, because aluminum can be sputter deposited and reflowed into the plug, it results in a metallization scheme with a significant reduction in the number of processing steps. However, as the dimensions of the vias decrease to less than 0.5 micron ($\mu$) in new generations of semiconductor devices, current methods for filling plugs with aluminum are also subject to the formation of holes or voids.

FIGS. 1a through 1c illustrate the problems associated with filling small openings in a semiconductor wafer using prior art methods of reflowing aluminum and aluminum alloys. FIG. 1a illustrates a cross-sectional view of a semiconductor wafer (wafer) having a dielectric layer 120 formed over a substrate 110. Opening 130 may be formed in dielectric layer 120 using standard photoresist and etch techniques.

A wetting layer 140, for example titanium (Ti), is deposited over the wafer and lines the sidewalls and bottom of opening 130. Wetting layer 140 helps to reduce the interfacial energy between the aluminum that is to be deposited and substrate 110 and/or dielectric layer 120. Wetting layer 140 also helps to reduce or avoid agglomeration between the aluminum that is to be deposited and substrate 110 and/or dielectric layer 120.

Typical prior art methods deposit the aluminum in two steps, a cold deposition step followed by a hot deposition step. In one prior art method an aluminum layer 160 is sputter deposited over wetting layer 140 during the cold deposition step and is reflowed into opening 130 during the hot deposition step, as is illustrated in FIG. 1b. At the relatively higher temperature for reflow, however, aluminum (Al) layer 160 reacts with titanium (Ti) wetting layer 140 and forms intermetallic (TiAl$_3$) compound layer 150. It should be noted however, that not all of aluminum layer 160 will react with titanium wetting layer 140 to form intermetallic (TiAl$_3$) compound layer 150. As soon as all the available titanium in titanium wetting layer 140 has reacted to form TiAl$_3$, the remaining aluminum being deposited forms aluminum layer 160 and the aluminum (Al) plug 165. FIG. 1c illustrates a cross-sectional view of a semiconductor wafer after opening 130 has been completely filled with aluminum.

One of the problems with using a cold and a hot deposition step is that the overhang of the low temperature aluminum layer tends to close or "pinch" the top of the opening, especially in small vias (i.e. less than 0.5 micron ($\mu$)), as is illustrated in FIG. 1b. Consequently, as is illustrated in FIG. 1c, the migration of aluminum (Al) into the opening during the high temperature aluminum fill may slow down, and cause a hole or void 170 to form in the plug 165. Void 170 may decrease the reliability of the circuit by reducing the conductance and reliability of the aluminum plug 165 or create an open circuit in the semiconductor device being fabricated.

Prior art methods for controlling void formation include, for example, forming openings in the semiconductor wafer with rounded edges, as illustrated in FIG. 2a. Since the edges of opening 230 formed in dielectric layer 220 are rounded, when aluminum layer 260 is sputter deposited and reflowed into opening 230, as is illustrated in FIG. 2b, the aluminum does not form overhangs and consequently does not pinch the top of opening 230. As illustrated in FIG. 2c, the remaining aluminum may be sputter deposited and reflowed into opening 230 without the formation of voids or holes.

One problem with forming openings with rounded edges, however, is that they require a larger area (or space) on the surface of the semiconductor device. As can be seen in FIG. 2b, the plug formed using the opening with rounded edges requires additional space on the wafer where a plug formed with vertical sidewalls requires less space on the wafer, as can be seen in FIG. 1c. Consequently this consideration weighs against the formation of smaller and/or more dense semiconductor devices.

Another prior art method for controlling void formation is described in Chen et al., U.S. Pat. No. 5,108,951, issued on Apr. 28, 1992. The process described in Chen et al. uses several process steps. In the first step of Chen et al. aluminum is sputter deposited on the wafer using a cold deposition technique (i.e. less than 350° C.). Next, or in the second step, Chen et al. heats the wafer. As the wafer in Chen et al. is warmed (heated) the aluminum deposited in the cold deposition step, gradually begins to reflow into the opening. Once the wafer in Chen et al. reaches a deposition temperature (i.e. approximately 450° C.) the remaining aluminum is deposited and reflowed into the opening until the opening is completely filled.

One problem with the method described in Chen et al. is that the time required, between the cold deposition step and the relatively hotter deposition step, to heat the wafer decreases the throughput of the system. Additionally, the cold-hot process of Chen et al. exhibits the problems of void formation, described above, in small vias, for example, less than 0.5 micron (<0.5$\mu$).

Other prior art methods use multiple steps to deposit the aluminum, however they use higher temperatures to perform each step. The problem with these techniques and with the hot deposition step of the Chen et al. process is that during these processes the temperatures get too hot, for example, over 450° C., and can cause damage to other underlying layers within the semiconductor device. For example, as temperatures increase this may cause the underlying interlayer dielectrics (ILDs) to crack which may in turn cause reliability problems. Another example is that underlying metal lines may amorphize at the higher temperature causing them to react with surrounding materials and forming compounds upon recooling. Yet another example is that high temperatures may cause high stresses within the underlying films that could lead to delamination of vias tied to those films.

Thus, what is needed is a method for filling an opening having vertical sidewalls in a semiconductor device using a method that reduces or avoids the formation of voids, while maintaining lower temperatures but that allows the formation of relatively more dense and/or smaller semiconductor devices.

SUMMARY OF THE INVENTION

The present invention describes an improved process for forming a metal plug without reaching temperatures that could cause damage to underlying layers during the fabrication of a semiconductor device. An opening is formed in a wafer. The opening is filled with a metal by depositing a first layer of the metal at a first power in a hot deposition chamber and then depositing a second layer of the metal at a second power in a cold deposition chamber.

BRIEF DESCRIPTION OF THE DRAWINGS

The present invention is illustrated by way of example and not limitation in the accompanying figures in which.

DETAILED DESCRIPTION

Figure 1A:
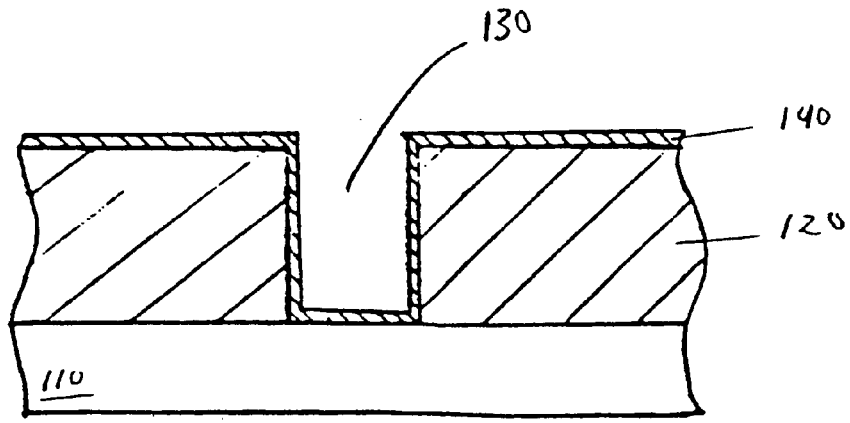
FIG. 1a illustrates a cross-sectional view of a semiconductor wafer after a titanium wetting layer has been deposited over the wafer.
Figure 1B:
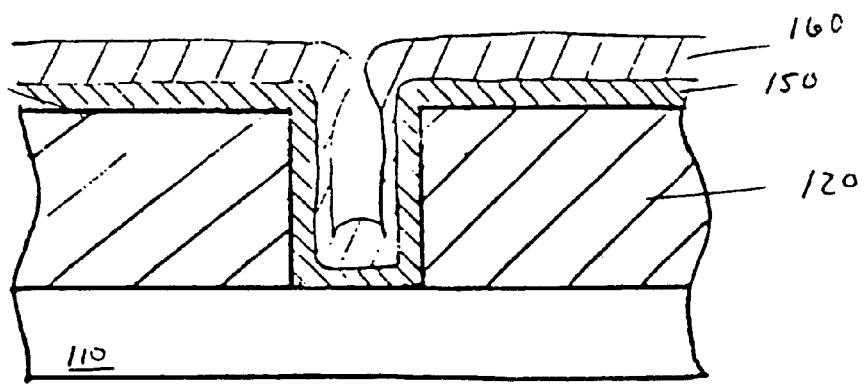
FIG. 1b illustrates a cross-sectional view of the semiconductor wafer in FIG. 1a after an aluminum layer has been sputter deposited and reflowed over the wafer during a cold deposition step.
Figure 1C:
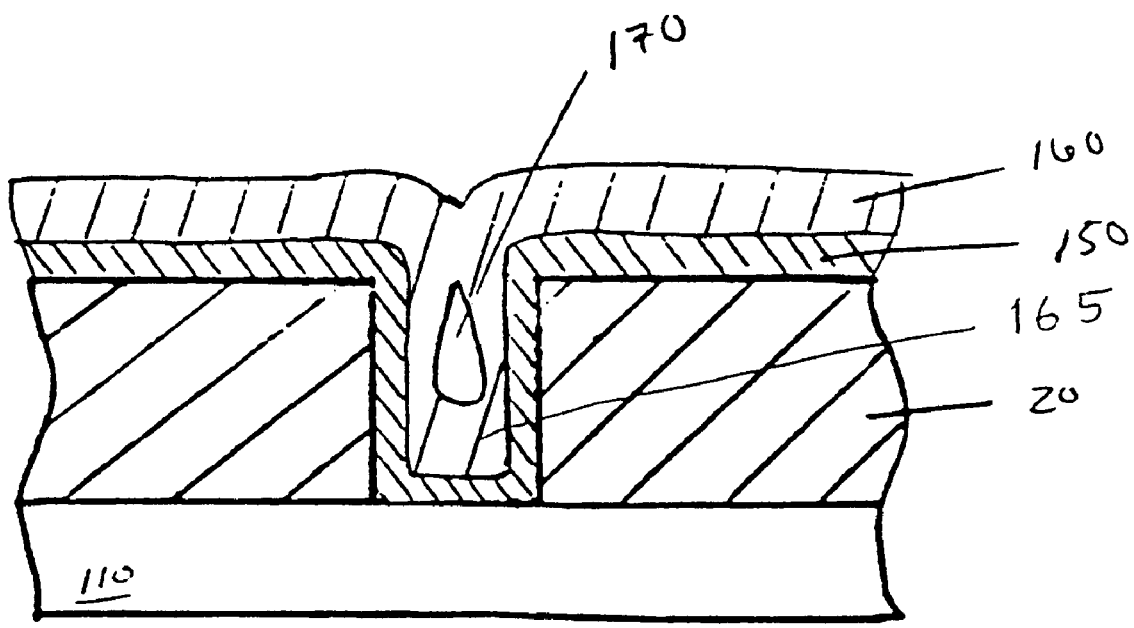
FIG. 1c illustrates a cross-sectional view of the semiconductor wafer in FIG. 1b after the remainder of the aluminum layer has been sputter deposited and reflowed over the wafer in a hot deposition step.
Figure 2A:
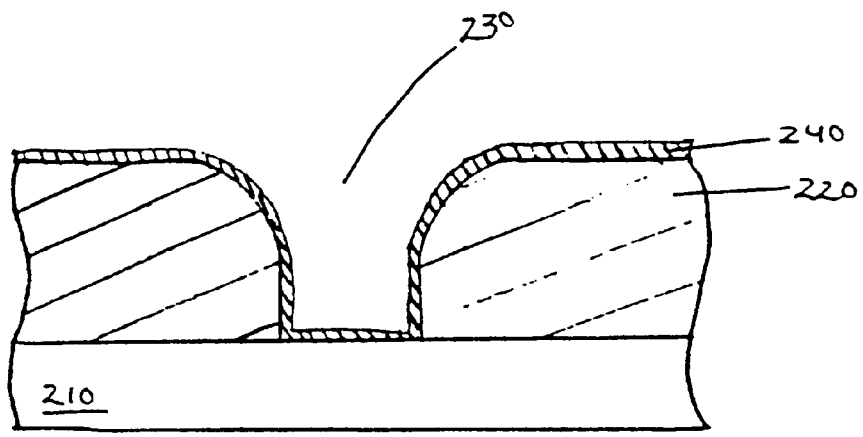
FIG. 2a illustrates a cross-sectional view of a semiconductor wafer wherein an opening with rounded edges has been formed.
Figure 2B:
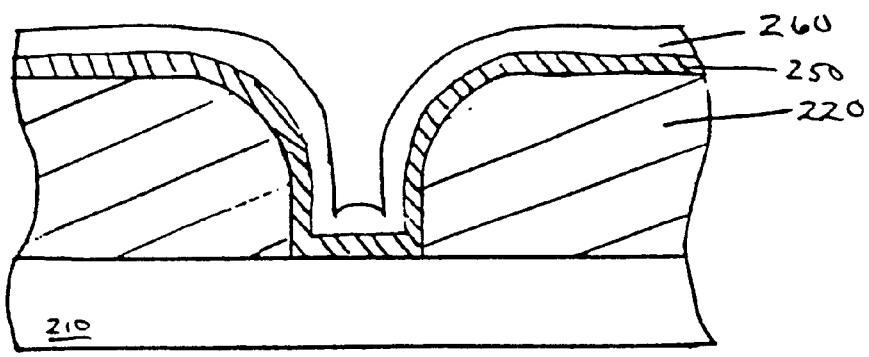
FIG. 2b illustrates a cross-sectional view of the semiconductor wafer in FIG. 2a after an aluminum layer has been sputter deposited and reflowed over the rounded edges of the opening formed in the wafer.
Figure 2C:
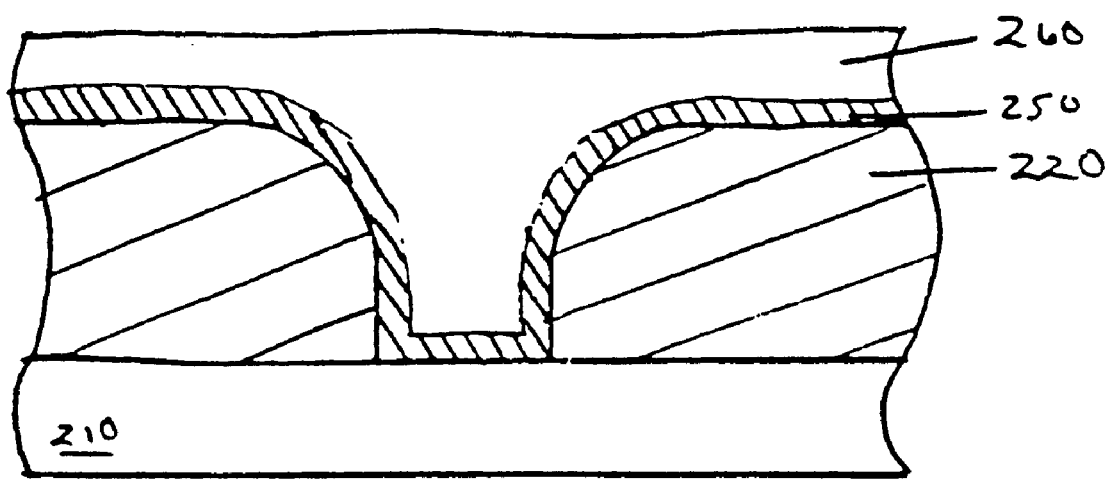
FIG. 2c illustrates a cross-sectional view of the semiconductor wafer in FIG. 2b after the remainder of the aluminum layer has been sputter deposited and reflowed over the rounded edges of the opening formed in the wafer.

A Two Chamber Aluminum Reflow Process to Reduce the Temperature for Aluminum Plug Technology is disclosed. In the following description, numerous specific details are set forth such as specific materials, process steps, process parameters, dimensions, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

As stated above in the Background of the Invention, as semiconductor devices become smaller and more dense, so must the conductive contacts, plugs, vias, and interconnect lines of those devices. The present invention describes an improved process for forming conductive layers in a semiconductor wafer that reduces or avoids the formation of holes or voids. The present invention also reduces the temperature associated with aluminum fill techniques in order to decrease potential damage to underlying layers of the semiconductor device during the via fill process.

In the manufacture of semiconductor devices, and more specifically in the formation of conductive (metal) layers, the present invention may be employed when filling openings (or vias) that have vertical sidewalls and/or small dimensions, for example, dimensions less than 0.5 micron ($\mu$). The present invention helps to maintain the electrical conductance of the metal layer and avoid the formation of open circuits, thus improving the reliability of the semiconductor device.

It is to be noted that although the present invention is described in conjunction with the formation of aluminum alloy plugs, the present invention may be used in the formation of many different types of conductive layers, for example: contacts, interconnect lines, etc. It should also be noted that although the present invention is described and depicted (in the Figures) as being used for openings (or vias) formed in a dielectric layer located directly above the substrate, the present invention may be used in vias which are formed in other materials and/or on other levels of a semiconductor wafer. Thus, the description and figures of the present invention are merely illustrative and are not intended to limit the scope of the invention. It will be appreciated that the broader spirit and scope of the present invention, as set forth in the appended claims, may be applied to any conductive layer which seeks the advantages of the present invention.

Additionally, it is to be noted that the term semiconductor wafer is used throughout the present disclosure. Semiconductor wafer is used to refer to a silicon semiconductor substrate or a part thereof, such as gallium arsenide, upon which device layers have been or are going to be formed. It should also be noted that the term substrate includes but is not limited to: fully processed, semi-processed, or unprocessed substrates with semiconductor materials thereon.

Figure 3A:
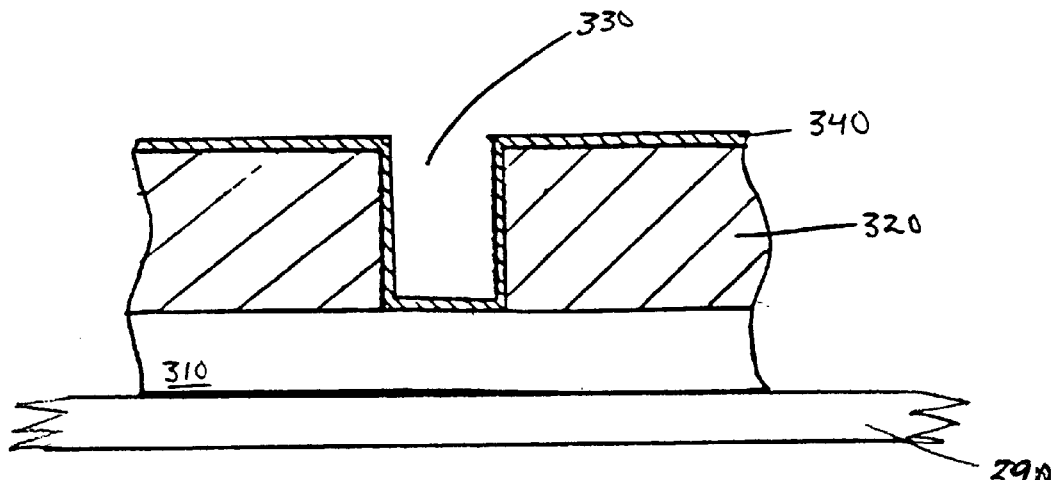
FIG. 3a illustrates a cross-sectional view of a semiconductor wafer after a titanium wetting layer has been deposited over the wafer.

The general processing steps used in the manufacture of semiconductor devices, for example the formation of vias, are well known in the art and will be obvious to one with ordinary skill in the art, therefore, these steps are not described in detail. FIG. 3a illustrates an opening formed in a semiconductor wafer (or substrate). Opening 330 is formed using standard photoresist and etch techniques such that opening 330 has vertical sidewalls and dimensions of less than 0.5 micron ($\mu$). Opening 330 is illustrated such that it is formed in dielectric layer 320 and directly above substrate 310; however, it will be obvious to one with skill in the art that opening 330 may be formed in other materials and/or on other levels of the semiconductor wafer (or substrate).

Wetting layer 340 has been deposited over the semiconductor wafer (wafer) and lines the sidewalls and bottom of opening 330. In one currently preferred embodiment a titanium (Ti) wetting layer is used. It should be noted and it will be obvious to one with ordinary skill in the art that other wetting layers, for example: titanium nitride, titanium aluminide, etc. may also be used. As previously described in the Background of the Invention, wetting layer 340 helps to reduce the interfacial energy between the aluminum that is to be deposited and substrate 310 and/or dielectric layer 320. Wetting layer 340 also helps to reduce or avoid agglomeration between the aluminum that is to be deposited and substrate 310 and/or dielectric layer 320.

Once wetting layer 340 has been deposited then opening 330 may be filled with aluminum. Rather than deposit and reflow the aluminum in two steps, where the last step is done at high temperatures, as previously done in the prior art, the present invention deposits the aluminum in steps and at different powers (or deposition rates), but the last step is performed at a lower temperature, (i.e. a hot-cold deposition process).

Figure 3B:
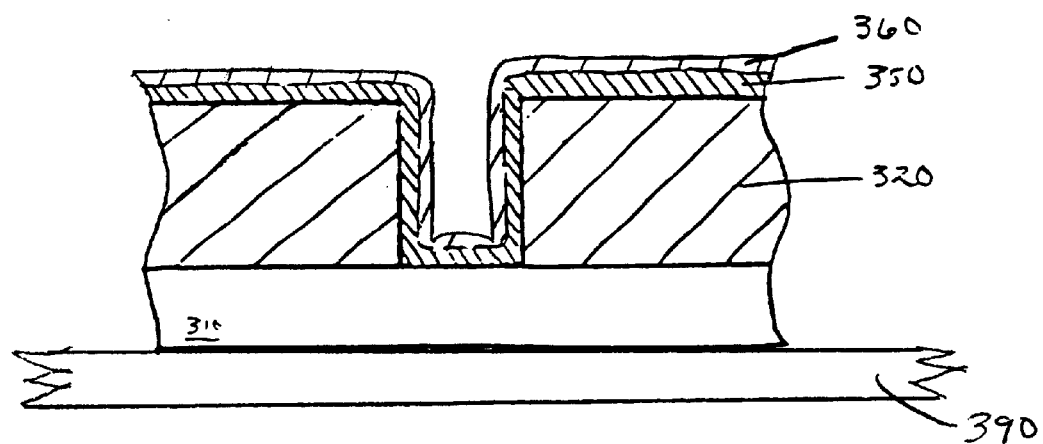
FIG. 3b illustrates a cross-sectional view of the semiconductor wafer in FIG. 3a after beginning to fill the via with aluminum by sputter depositing and reflowing aluminum over the wafer at a first power in a hot deposition chamber.

FIG. 3b illustrates the early stages of the first deposition step. In the first deposition step, aluminum is sputter deposited and reflowed into opening 330. The first deposition step of the present invention is performed in a hot deposition chamber and the wafer chuck 390 of the hot deposition chamber is heated to a temperature in the range of approximately 300–450° C. In one embodiment of the present invention wafer chuck 390 is heated to approximately 380° C. for the first deposition step.

The power of the first deposition step of the present invention remains low in order to have a slower deposition rate while initially filling the via. It should be noted and it will be obvious to one with ordinary skill in the art that power scales as the deposition rate. In other words, the lower the power of the process the slower the deposition rate and the higher the power of the process the faster the deposition rate. The power for the first deposition step in one embodiment of the present invention is approximately 2–3 kilowatts and corresponds to a deposition rate of approximately 20–60 angstroms per second (Å/sec).

It should be noted and it will be obvious to one of ordinary skill in the art that, the power will vary depending upon the particular process tool being used. The powers used herein correspond to the Epi Centura process tool available from Applied Materials Incorporated, Santa Clara, Calif. Thus, it should be noted that if another process tool is used the power may change, but the important concept is to keep the deposition rates as discussed. For example, use the corresponding power for the process tool that will enable a desposition rate of approximately 20–60 angstroms per second as discussed above for the first deposition step. The same will hold true for all deposition steps.

During the first deposition step the aluminum reacts with wetting layer 340 and forms an intermetallic compound layer 350. In one currently preferred embodiment a titanium aluminide (TiAl$_3$) intermetallic compound layer is formed. The lower deposition rate and the high temperature of the first deposition step allows the aluminum to flow more evenly into opening 330, thus aluminum layer 360 (formed using the present invention) forms minimal "overhangs" and delays the pinching of the top of opening 330 thereby leaving little or no void. It should be noted and it will be obvious to one with ordinary skill in the art that small voids such as those that may be left with the present invention may be sealed using "bulk diffusion." Bulk diffusion is commonly known in the art and therefore is not described herein in detail.

Figure 3C:
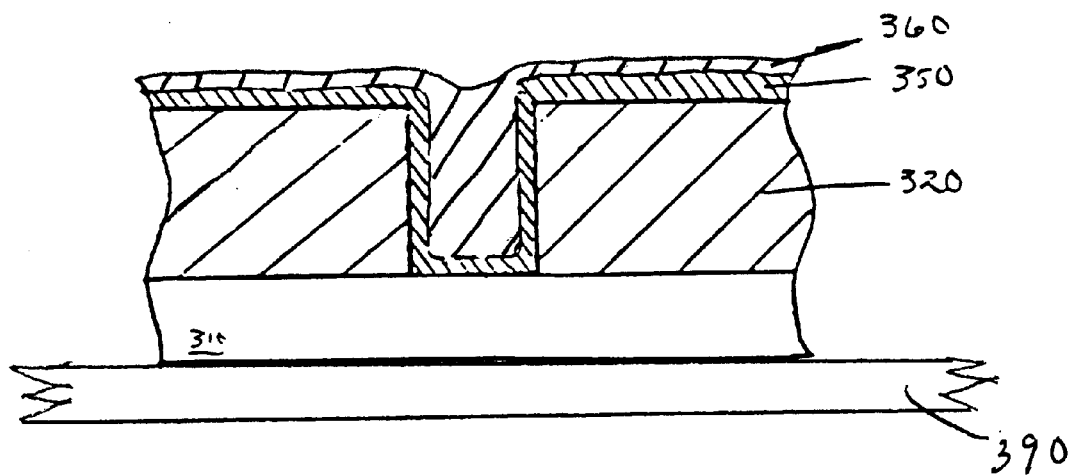
FIG. 3c illustrates a cross-sectional view of the semiconductor wafer in FIG. 3b after the via has been filled with aluminum by sputter depositing and reflowing aluminum over the wafer at a second power in a hot deposition chamber.

FIG. 3c illustrates the second deposition step at the point when the via is completely filled. In the second deposition step, aluminum is sputter deposited and reflowed into opening 330 to completely fill the via. The second deposition step is performed in the same hot deposition chamber as the first deposition step and the wafer chuck 390 of the hot deposition chamber remains heated to a temperature in the range of approximately 300–450° C. It should be noted that the second deposition step may be performed in a separate deposition chamber, however, it would still be desirous that the separate deposition chamber be a hot deposition chamber to promote the reflow of the aluminum into the via without the formation of voids.

Because in the first deposition step the bottom of the via is filled, the power (or deposition rate) of the second step may be increased in order to increase the throughput of the manufacturing process. However, the power in the second deposition step should still remain relatively low in order to completely fill the via. It should be noted that when the via is not completely filled, increasing the power too quickly would increase the deposition rate too quickly and may still subject the process to the formation of voids, therefore the power should still remain relatively low in the second deposition step. The power for the second deposition step in one embodiment of the present invention is approximately 3–5 kilowatts and corresponds to a deposition rate of approximately 50–100 angstroms per second (Å/sec).

It should be noted that the via fill may be performed in a single step process rather than having two deposition steps at two different powers as discussed above. In the process given above two deposition steps at two different powers are used merely to increase the throughput of the manufacturing process. Thus, there could be another embodiment that uses a single step via fill wherein the power of the single deposition step is approximately 2–5 kilowatts and corresponds to a deposition rate of approximately 20–100 angstroms per second (Å/sec).

Figure 3D:
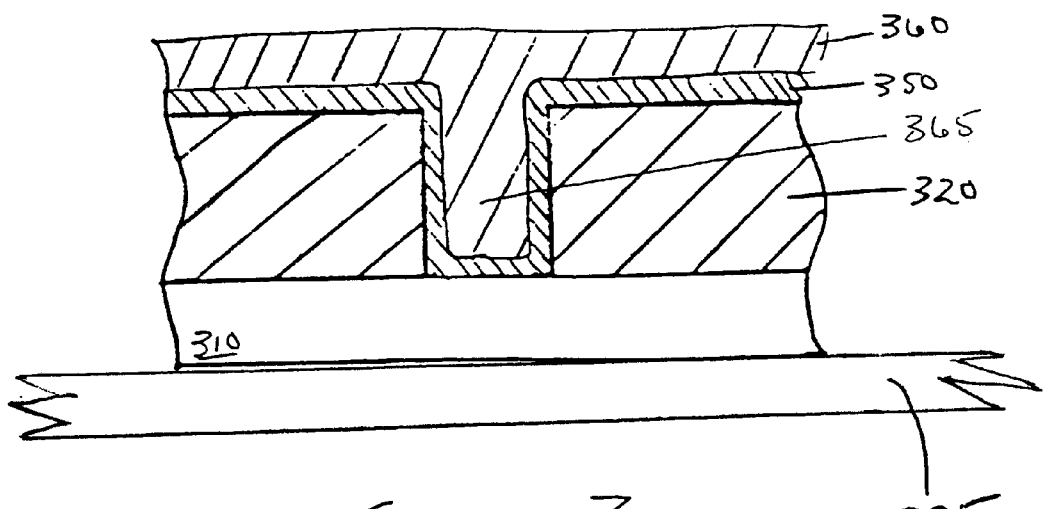
FIG. 3d illustrates a cross-sectional view of the semiconductor wafer in FIG. 3c after the via has been filled and during buildup of the thickness of the aluminum layer by sputter depositing and reflowing aluminum over the wafer at a third power in a cold deposition chamber.

After the second deposition step is finished and the via is filled the remaining aluminum to be deposited just builds up the thickness of the aluminum layer. FIG. 3d illustrates the third deposition step at the point when the via has been completely filled and the thickness of the aluminum layer is being built up. In order to increase throughput of the manufacturing process it is desirable to perform the third deposition step, i.e. the buildup, at a faster deposition rate. In other words, the power of the process is increased in order to increase the deposition rate. For example, the power may be increased to approximately 7–9 kilowatts and corresponds to a deposition rate of approximately 140–160 angstroms per second (Å/sec). In one embodiment of the present invention the power is increased to approximately 8 kilowatts during the third deposition step.

However, if this high power step is performed in the hot deposition chamber what is found is that the largest increases in temperature occur during sputter deposition of aluminum at higher powers. Thus, if the temperature in the hot deposition chamber is already approximately 300–450° C., during a high power deposition step it has been found that the temperature may rise to over 450° C. and might even exceed 500° C. As stated in the background of the invention, such high temperatures may cause problems with underlying layers that could ultimately affect device performance and reliability.

In order to reduce the temperature of the high power buildup step while increasing the throughput of the manufacturing process, the present invention transfers the wafer to a second chamber, a cold deposition chamber, where the high power buildup step is performed. In one embodiment of the present invention the wafer chuck 395 of the cold deposition chamber is at ambient temperature. With wafer chuck 395 of the cold deposition chamber starting at ambient temperature, the high power sputtering process will raise the temperature in the chamber, however, the temperature will only rise to somewhere around 100° C. It should be noted that the wafer chuck in the cold deposition chamber could also be heated, such that it is at a higher temperature than ambient temperature, for example up to approximately 200° C., and the temperature of high power buildup step will still rise, however it will not reach above 450° C.

Since aluminum layer 360 forms minimal overhangs in the first and second deposition steps, the migration of aluminum (Al) in the third deposition step is not affected and little or no voids are formed in the plug 365. Because little or no voids (or holes) are formed, the reliability of the aluminum plug 365 and hence of the semiconductor device manufactured using the present invention is improved. Additionally, since the present invention allows the deposition and reflow of aluminum without the formation of overhangs, the present invention allows the use of openings with smaller dimensions and vertical sidewalls, thus allowing for the fabrication of smaller and/or more dense semiconductor devices. Thus, as the dimensions of the vias decrease to less than 0.5 micron ($\mu$) in new generations of semiconductor devices, the present invention offers a method for filling plugs with aluminum without the formation of holes or voids.

It should be noted that the present invention may be used for other metals such as aluminum alloys, copper, and copper alloys and that the above description is merely illustrative and is not limiting to just aluminum. Additionally, it should be noted that although the above description discusses via and plug technology the present invention may also be used to fill holes and trenches.

Thus, a Two Chamber Aluminum Reflow Process to Reduce the Temperature for Aluminum Plug Technology has been described. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A process comprising:
    forming an opening; and
    filling said opening with a metal, wherein filling said opening includes:
       first depositing a first layer of the metal at a first power;
       then depositing a second layer of the metal directly on the first layer at a second power;
       then depositing a third layer of the metal directly on the second layer at a third power and in a separate chamber from depositing the first and the second layers of the metal, wherein depositing the third layer of the metal is performed at a lower temperature than depositing the first and the second layers of the metal.

2. The process as described in claim 1, wherein the first power is between approximately 2 to 3 kilowatts.

3. The process as described in claim 1, wherein the second power is between approximately 3 to 5 kilowatts.

4. The process as described in claim 1, wherein depositing the first layer of the metal is performed at a temperature in the range of approximately 300° to 450° C.

5. The process as described in claim 1, wherein depositing the second layer of the metal is performed at a temperature in the range of approximately 300° to 450° C.

6. The process as described in claim 1, wherein the first layer of the metal is deposited at a deposition rate between approximately 20 to 60 Å/second.

7. The process as described in claim 1, wherein the second layer of the metal is deposited at a deposition rate between approximately 50 to 100 Å/second.

8. The process as described in claim 1, wherein the first and the second layers of the metal are deposited in the same deposition chamber.

9. The process as described in claim 1, wherein the first and the second layers of the metal are deposited in different deposition chambers.

10. The process as described in claim 1, wherein the third power is between approximately 7 to 9 kilowatts.

11. The process as described in claim 1, wherein depositing the third layer of the metal is performed at a temperature in the range of approximately ambient temperature to 200° C.

12. The process as described in claim 1, wherein the third layer of the metal is deposited at a deposition rate between approximately 140 to 160 Å/second.

13. A process comprising:
    forming an opening having sidewalls and a bottom;
    depositing a wetting layer on the sidewalls and the bottom of said opening; and
    filling said opening with a metal, wherein filling said opening includes:
       first depositing a first layer of the metal at a first power;
       then depositing a second layer of the metal directly on the first layer at a second power;
       then depositing a third layer of the metal directly on the second layer at a third power and in a separate chamber from depositing the first and the second layers of the metal, wherein depositing the third layer of the metal is performed at a lower temperature than depositing the first and the second layers of the metal.

14. The process as described in claim 13, wherein the wetting layer comprises titanium.

15. The process as described in claim 13, wherein the wetting layer is deposited at a temperature in the range of approximately 300° to 450° C.

16. The process as described in claim 13, wherein the first power is between approximately 2 to 3 kilowatts.

17. The process as described in claim 13, wherein the second power is between approximately 3 to 5 kilowatts.

18. The process as described in claim 13, wherein depositing the first layer of the metal is performed at a temperature in the range of approximately 300° to 450° C.

19. The process as described in claim 13, wherein depositing the second layer of the metal is performed at a temperature in the range of approximately 300° to 450° C.

20. The process as described in claim 13, wherein the first layer of the metal is deposited at a deposition rate of between approximately 20 to 60 Å/second.

21. The process as described in claim 13, wherein the second layer of the metal is deposited at a deposition rate of between approximately 50 to 100 Å/second.

22. The process as described in claim 13, wherein the first and the second layers of the metal are deposited in the same deposition chamber.

23. The process as described in claim 13, wherein the first and the second layers of the metal are deposited in different deposition chambers.

24. The process as described in claim 13, wherein the third power is between approximately 7 to 9 kilowatts.

25. The process as described in claim 13, wherein depositing the third layer of the metal is performed at a temperature in the range of approximately ambient temperature to 200° C.

26. The process as described in claim 13, wherein the third layer of the metal is deposited at a deposition rate between approximately 140 to 160 Å/second.

* * * * *